United States Patent
Kim et al.

(10) Patent No.: US 6,627,384 B1
(45) Date of Patent: Sep. 30, 2003

(54) PHOTORESIST COMPOSITION FOR RESIST FLOW PROCESS AND PROCESS FOR FORMING A CONTACT HOLE USING THE SAME

(75) Inventors: Hyeong Soo Kim, Kyoungki-do (KR); Jae Chang Jung, Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 61 days.

(21) Appl. No.: 09/699,165

(22) Filed: Oct. 27, 2000

(30) Foreign Application Priority Data

Oct. 29, 1999 (KR) ........................ 1999-47623

(51) Int. Cl.[7] ................ G03F 7/004; G03F 7/038; G03F 7/039; C08K 5/42; C08L 101/00
(52) U.S. Cl. .................. 430/280.1; 430/270.1; 430/311; 430/330; 430/326; 430/319; 438/760
(58) Field of Search ............ 430/280.1, 270.1, 430/311, 330, 326, 319; 438/760

(56) References Cited

U.S. PATENT DOCUMENTS

| | | | | |
|---|---|---|---|---|
| 4,220,731 A | * | 9/1980 | Zuppinger | 521/156 |
| 4,383,025 A | * | 5/1983 | Green et al. | 430/280.1 |
| 5,070,002 A | * | 12/1991 | Leech et al. | 430/280.1 |
| 5,215,863 A | * | 6/1993 | Nawata et al. | 430/280.1 |
| 5,882,843 A | * | 3/1999 | Kudo et al. | 430/280.1 |
| 5,914,216 A | * | 6/1999 | Amou et al. | 430/280.1 |
| 5,919,601 A | * | 7/1999 | Nguyen et al. | 430/270.1 |
| 5,939,236 A | * | 8/1999 | Pavelchek et al. | 430/270.1 |
| 6,093,753 A | * | 7/2000 | Takahashi | 522/25 |
| 6,127,092 A | * | 10/2000 | Schon | 430/280.1 |
| 6,316,165 B1 | * | 11/2001 | Pavelchek et al. | 430/271.1 |
| 6,338,936 B1 | * | 1/2002 | Ichikawa et al. | 430/280.1 |

FOREIGN PATENT DOCUMENTS

EP 1 035 442 A2 * 9/2000

OTHER PUBLICATIONS

S. H. Hwang et al, Polymer, vol. 41, Aug. 2000, pp. 6691–6694.*

* cited by examiner

*Primary Examiner*—Cynthia Hamilton
(74) *Attorney, Agent, or Firm*—Townsend and Townsend and Crew LLP

(57) ABSTRACT

The present invention relates to photoresist compositions for resist flow process and processes for forming a contact hole pattern using the same. In particular, the present invention relates to photoresist composition comprising a thermal curing agent which cures photoresist composition at an elevated temperature. In one embodiment, the thermal curing agent comprises a thermal acid generator and a curing compound. Preferably, the curing compound comprises a cross-linking moiety which is capable of curing the photoresist composition when reacted with the acid that is generated by the thermal acid generator. Photoresist compositions of the present invention reduces or eliminate overflow of photoresist during a resist flow process, thereby preventing a contact hole pattern from being destroyed. In addition, photoresist compositions of the present invention allow formation of uniform sized patterns and increase in etching selection rate.

13 Claims, 2 Drawing Sheets

PHOTORESIST COMPOSITION FOR RESIST FLOW PROCESS AND PROCESS FOR FORMING A CONTACT HOLE USING THE SAME

BACKGROUND OF THE INVENTION

1. Field of the Invention

The present invention relates to photoresist compositions for a resist flow process and a process for forming a contact hole using the same. In particular, the present invention relates to a photoresist composition comprising a thermal curing agent which cures the photoresist composition at an elevated temperature; and a method for forming a contact hole using the same.

2. Description of the Background Art

Resist flow is a processing technology for forming a fine contact hole which exceeds the resolution of the exposing device.

The resist flow process has recently made remarkable developments and so that it is now used in mass production processes. The technology generally involves an exposure process and a development process. This process forms a photoresist contact hole having a resolution equal to that of the exposing device. The process also includes heating the photoresist to a temperature higher than the glass transition temperature of the photoresist which causes the photoresist to flow. The contact hole gets smaller by the flow of photoresist until a fine contact hole necessary for the integration process is obtained (see FIG. 1).

Thus, the resist flow process makes it possible to obtain contact holes smaller than the resolution of an exposing device. However, one major limitation of the resist flow process is that an excessive thermal flow (i.e., "overflow") covers or destroys the contact hole pattern. The over flow can occur due to several factors including photoresist's sensitivity to heat, imprecise temperature control, and imprecise control of the flow time. Any one or more of these factors cause an excessive thermal flow, which results in the photoresist covering the contact hole. Such overflow can be seen in FIG. 2, which shows a graph of the baking temperature versus the size of final contact hole. As FIG. 2 shows, the size of a 200 nm contact hole decreases remarkably as the baking temperature increases from 100° C. to 140° C. This decrease in contact hole size is believed to be due to the photoresist undergoing a rapid thermal flow even with a slight increase in temperature.

Attempts to solve the overflow problem by improving the baking process, such as maintaining a uniform baking temperature and/or controlling the precise baking time, have been mostly unsuccessful.

SUMMARY OF THE INVENTION

Accordingly, it is an object of the present invention to provide photoresist compositions for a resist flow process.

Another object of the present invention is to provide a resist flow process for forming a photoresist pattern using such photoresist composition.

Still another object of the present invention is to provide a contact hole formation method employing the photoresist pattern formed by the above-described process.

DETAILED DESCRIPTION OF THE INVENTION

Figure 1:
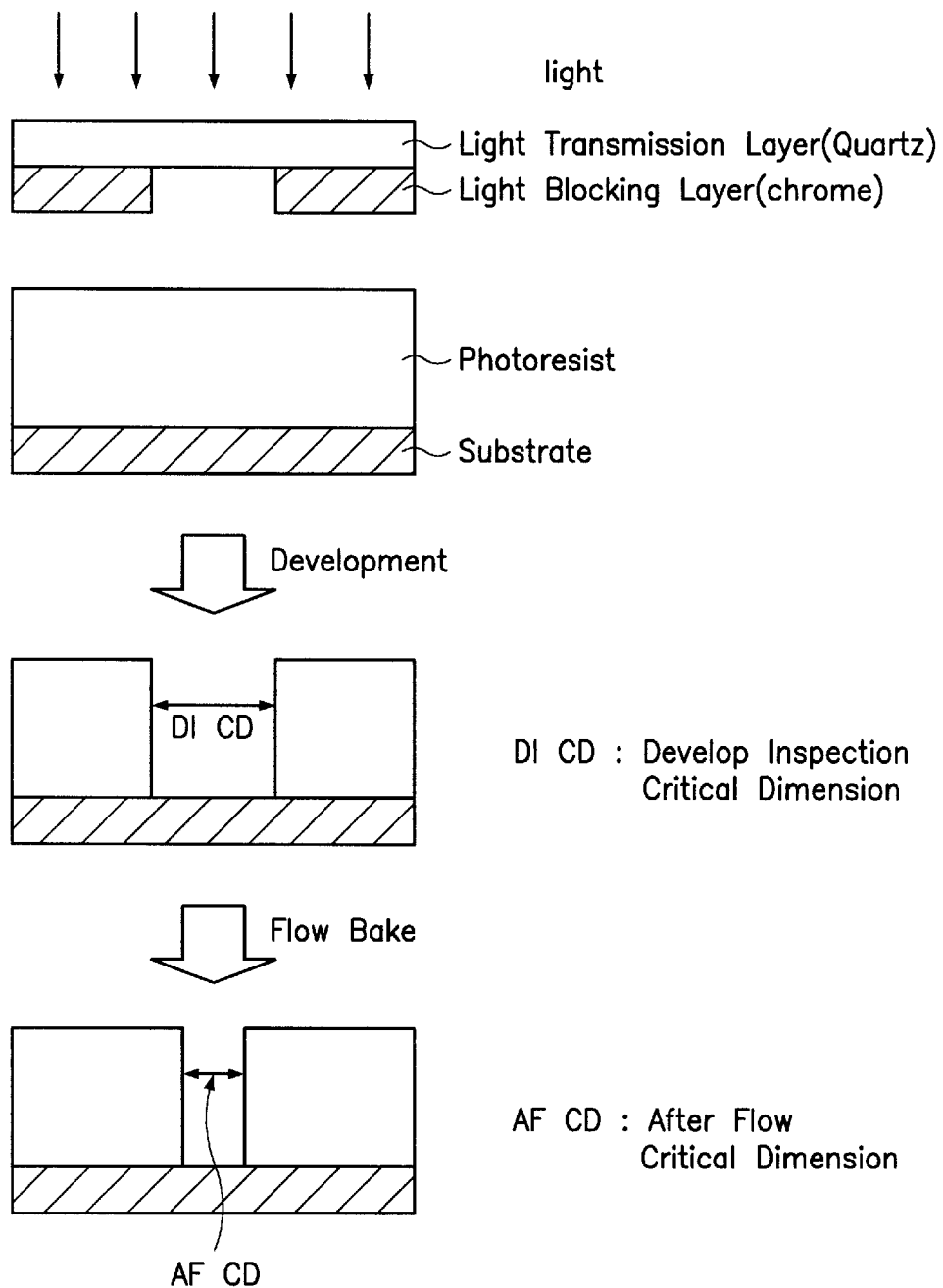
FIG. 1 is a schematic view of a conventional resist flow process.

The present invention provides a photoresist composition comprising a thermal curing agent, which is capable of curing the photoresist composition when heated to a particular temperature range. Preferably, the thermal curing agent is capable of curing the photoresist composition at a temperature range where the photoresist composition becomes flowable.

In one particular embodiment of the present invention, the thermal curing agent is capable of curing the photoresist composition at temperature of 110° C. or above, preferably at 130° C. or above, and more preferably at 140° C. or above. In this manner, thermal curing agents of the present invention reduce or prevent overflow during a flow bake process (i.e., resist flow process). The amount (i.e., degree) of photoresist composition curing depends on the amount of thermal curing agent present in the photoresist composition. Typically, a higher amount of thermal curing agent in the photoresist composition provides a contact hole pattern with a higher thermal stability (i.e., able to maintain a substantially similar contact hole size). As used herein, the term "substantially similar contact hole size" refers to a contact hole size that is within about 20% of the contact hole size in the beginning of the curing stage. And conversely, a smaller amount of thermal curing agent in the photoresist composition provides a contact hole pattern with a lower thermal stability (i.e., the contact hole size decreases gradually at an elevated temperature and changes significantly relative to the contact hole size in the beginning of the curing stage).

In one aspect of the present invention, the thermal curing agent comprises a thermal acid generator and a curing compound. A thermal acid generator is a compound which is capable of generating an acidic moiety when heated, e.g., during the baking step or the resist flow process. The curing compound is selected from a group of compounds that is capable of curing the photoresist composition when contacted (i.e., reacted) with the acid that is generated by the thermal acid generator.

In one embodiment of the present invention, the thermal curing agent comprises more than one thermal acid generator. In another embodiment of the present invention, the thermal curing agent comprises more than one curing compound.

Preferably, the curing compound comprises a cross-linking moiety. Without being bound by any theory, it is believed that the cross-linking moiety present in the curing compound is responsible for curing the photoresist composition, thereby reducing or eliminating the overflow during the baking step and the resist flow process.

Exemplary thermal acid generators include alcohols comprising a leaving group, preferably located adjacent to the alcohol functional group. It has been found by the present inventors that an alcohol comprising a sulfonate group is a particularly useful thermal acid generator. Preferably, thermal acid generators include, but are not limited to, compounds of Formulas 1 to 4:

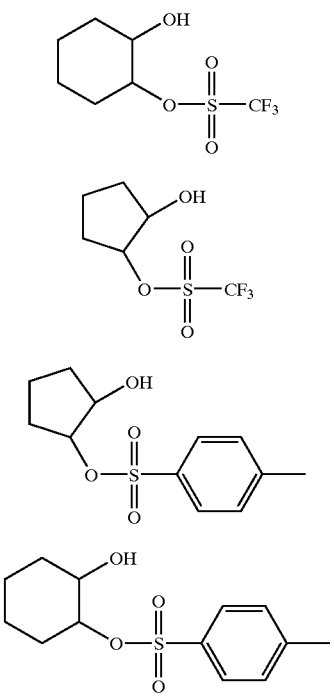

Exemplary cross-linking moieties include acetals and epoxides. Thus, curing compounds comprising a cross-linking moiety include, but are not limited to, compounds of Formulas 5 to 8:

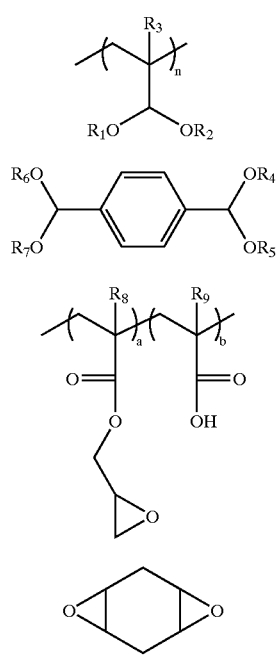

where each of $R_1$, $R_2$, P4, $R_5$, $R_6$, and $R_7$ is independently substituted or unsubstituted linear or branched $C_1$–$C_5$ alkyl; each of $R_3$, $R_8$, and $R_9$ is hydrogen or alkyl, preferably methyl; n is an integer such that the molecular weight of compound 5 is from about 1000 to about 5000; and a and b are integers such that the molecular weight of compound 7 is from about 1000 to about 5000, preferably the mole ratio of a:b is 0.75:0.25.

In one particular embodiment of the present invention, the photoresist composition comprises a photoresist resin, a photo acid generator, an organic solvent, and a thermal curing agent described above.

Typically, the, amount of thermal acid generator and the total amount of curing compound are from about 0.1 to about 50% by weight of the photoresist resin employed. Preferably, the amount of thermal acid generator is from about 0.1 to about 5% by weight of the photoresist resin employed. Preferably, the amount of curing compound is from about 1 to about 10% by weight of the photoresist resin employed.

The photoresist resin can be any currently known chemically amplified photoresist resin.

Preferred photoacid generators include sulfide and onium type compounds. In one particular embodiment of the present invention, the photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate and dibutylnaphthylsulfonium triflate.

While a variety of organic solvents are suitable for use in the photoresist composition of the present invention, the organic solvent selected from the group consisting of propylene glycol methyl ether acetate, ethyl lactate, methyl 3-methoxypropionate, ethyl 3-ethoxypropionate and cyclohexanone is preferred.

Another aspect of the present invention provides a method for reducing the size of contact hole on a photoresist pattern that is produced using the above described photoresist composition.

Yet another aspect of the present invention provides a process for producing a photoresist pattern comprising the steps of:

(a) coating the above described photoresist composition on a substrate to form a photoresist film;

(b) forming a first photoresist pattern using a lithography process (preferably having a lower resolution than the maximum resolution of an exposing device); and (c) performing a flow bake (i.e., resist flow) process to allow the photoresist to undergo thermal flow to form a second photoresist pattern.

Without being bound by any theory, it is believed that during the flow bake process of step (c), the thermal acid generator produces an acid which catalyzes cross-linking reaction of the curing compound with the photoresist resin. This cross-linking of the curing compound with the photoresist resin is believed to be responsible for limiting the flow of photoresist, and therefore preservation of the photoresist pattern.

Preferably, the flow bake process is conducted at a temperature greater than the glass transition temperature of the photoresist. Typically, the cross-linking reaction occurs at a temperature range of from about 90 to about 160 ° C.

Other thermal curing agents can also be used in the present invention provided that they are capable of curing the photoresist at a particular temperature range. As stated above, the degree of curing (e.g., cross-linking) is determined by the amount of thermal curing agent used. For example, if a large amount of the curing compound comprising a cross-linking moiety is used, it will produce a very strong cross-linking such that no additional significant flow of photoresist occurs for an extended period of time even at an elevated temperature. This provides a stable contact hole pattern, i.e., the contact hole size remains substantially similar to the contact hole size as the beginning of cross-linking process. If a small amount of the curing compound comprising a cross-linking moiety is used, then it will produce a substantially weak cross-linking. This weak cross-linking causes, the contact hole size to gradually decreases at an elevated temperature as time passes. See for example, FIG. 3.

Still another aspect of the present invention provides a method for preparing a contact hole using the photoresist composition described above. In particular, the substrate coated with a photoresist composition is etched using the second photoresist pattern (as described above) as an etching mask to form the contact hole.

Yet another embodiment of the present invention provides a semiconductor element that is manufactured using the photoresist composition described above.

The present invention will now be described in more detail by referring to the examples below, which are not intended to be limiting.

Comparative Example

Figure 2:
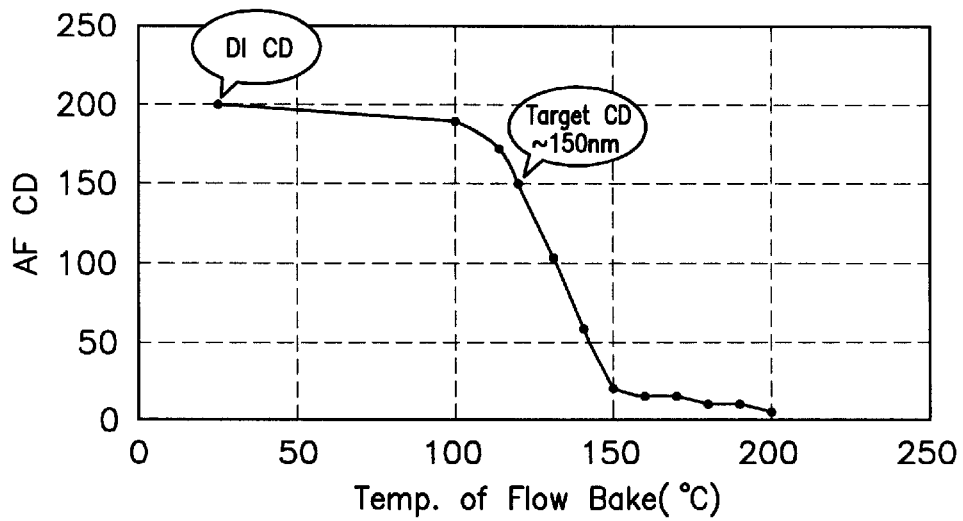
FIG. 2 is a graph of After Flow Critical Dimension (AFCD) versus temperature of flow bake, using the conventional photoresist composition.

A photoresist resin 402R KrF P/R (available from Shinetsu) was coated on the wafer, baked at 100° C. for 90 seconds and exposed to light using a 0.60NA KrF exposing device (Nikon S201). The photoresist composition was post-baked at 110° C. for 90 seconds, and developed in 2.38wt % aqueous TMAH solution to obtain a 200 nm L/S pattern. The resulting wafer was baked ate 100° C. for 90 seconds and subjected to a resist flow process at a temperature range of from 110 to 200° C. for 90 seconds. The size of the contact hole is shown in FIG. 2. As can be seen, when the 200 nm-contact hole is baked at temperature in the range of from 100 to 140° C., its size diminishes significantly. It is believed that this is due to thermal flow of the photoresist.

INVENTION EXAMPLE 1

Figure 3:
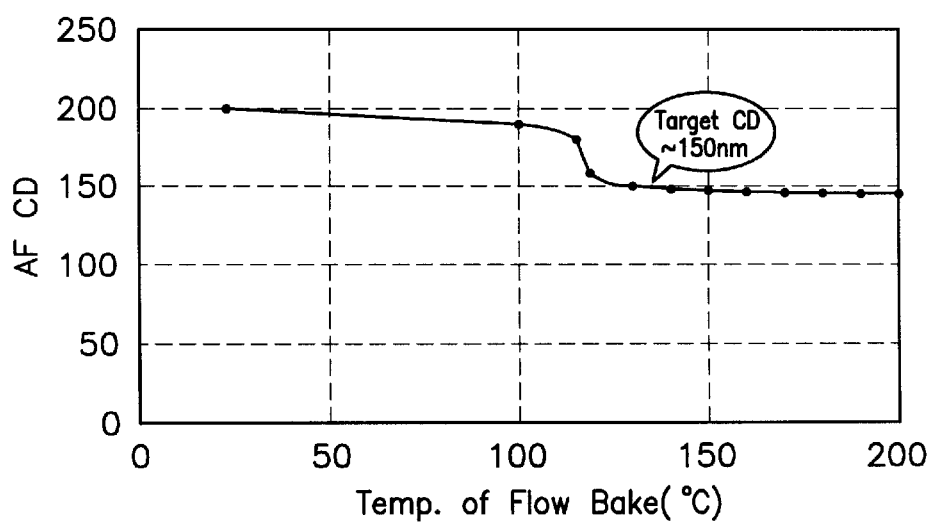
FIG. 3 is a graph of AFCD versus temperature of flow bake, using the photoresist composition of the present invention.

To 100 ml of photoresist 402R KrF P/R (available from Shinetsu) was added 0.4g of the thermal acid generator of Formula 4 and 2g of the curing compound of Formula 6. A 200 nm L/S pattern was obtained using this photoresist compositions and the procedure of Comparative Example. The contact hole size after subjecting the water to a baking step and a resist flow process is shown in FIG. 3. As FIG. 3 shows, in contrast to the Comparative Example, the contact hole can be safely reduced down to 150 nm without any significant overflow at a very high temperature, e.g., even at 150° C. or above.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A photoresist composition comprising a photoresist resin, a photo acid generator, an organic solvent, and a thermal curing agent, wherein said thermal curing agent comprises a curing compound comprising an acetal or an epoxide functional group as a cross-linker moiety and a thermal acid generator comprising a hydroxy group and a leaving group.

2. The photoresist composition of claim 1, wherein said leaving group is adjacent to said alcohol functional group.

3. The photoresist composition of claim 2, wherein said leaving group is a sulfonate.

4. The photoresist composition of claim 3, wherein said thermal acid generator is selected from the group consisting of compounds of the Formulas:

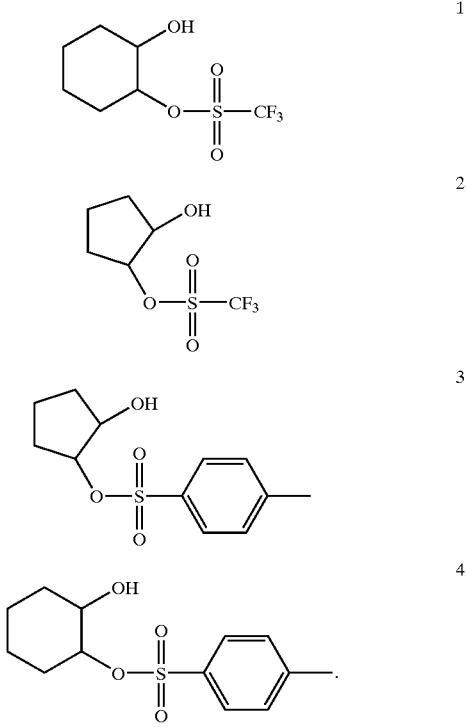

5. The photoresist composition of claim 1, wherein said curing compound is selected from the group consisting of compounds of the Formulas:

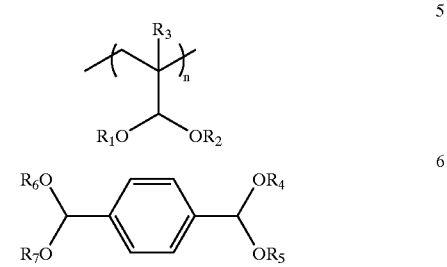

-continued

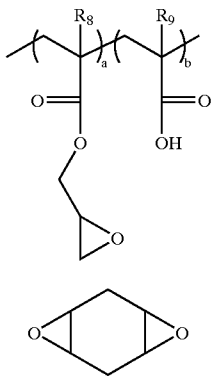

7 wherein
each of $R_1$, $R_2$, $R_4$, $R_5$, $R_6$, and $R_7$ is independently substituted or unsubstituted linear or branched $C_1$–$C_5$ alkyl;
each of $R_3$, $R_8$, and $R_9$ is hydrogen or alkyl, preferably methyl;
n is an integer such that the molecular weight of compound 5 is from about 1000 to about 5000; and
a and b are integers such that the molecular weight of compound 7 is from about 1000 to about 5000, preferably the mole ratio of a:b is 0.75:0.25.

6. The photoresist composition of claim 1, wherein the total amount of said thermal acid generator and the amount of said curing compound are from about 0.1 to about 50% by weight of said photoresist resin.

7. The photoresist composition of claim 6, wherein the amount of said thermal acid generator is from about 0.1 to about 5% by weight of said photoresist resin.

8. The photoresist composition of claim 6, wherein the amount of said curing compound is from about 1 to about 10% by weight of said photoresist resin.

9. A process for forming a photoresist pattern comprising the steps of:
(a) forming a first photoresist pattern on a substrate using a photoresist composition of claim 1; and
(b) subjecting said first photoresist pattern to a resist flow process to produce a second photoresist pattern.

10. The process of claim 9, wherein said step (a) further comprises the steps of:
(i) coating said photoresist composition on said substrate to form a photoresist film, wherein said substrate is a semiconductor devise; and
(ii) producing said first photoresist pattern using a lithography process.

11. The process of claim 9, wherein said resist flow process comprises heating said first photoresist pattern to a temperature above the glass transition temperature of said photoresist resin.

12. The process of claim 9, wherein said resist flow process comprises heating said first photoresist pattern to a temperature in the range of from about 90 to about 160° C.

13. The process of claim 9, wherein said first and second photoresist patterns comprise a contact hole pattern.

* * * * *

UNITED STATES PATENT AND TRADEMARK OFFICE
CERTIFICATE OF CORRECTION

PATENT NO.    : 6,627,384 B1
DATED         : September 30, 2003
INVENTOR(S)   : Hyeong Soo Kim and Jae Chang Jung It is certified that error appears in the above-identified patent and that said Letters Patent is hereby corrected as shown below:

Column 3,
Line 62, the terms "$R_1$, $R_2$, $P_4$, $R_5$, $R_6$, and $R_7$" should read
-- $R_1$, $R_2$, $R_4$, $R_5$, $R_6$, and $R_7$ --.

Column 4,
Line 7, the phrase "Typically, the, amount of thermal acid generator" should read
-- Typically, the amount of thermal acid generator --.

Signed and Sealed this

Ninth Day of March, 2004

JON W. DUDAS
*Acting Director of the United States Patent and Trademark Office*